United States Patent [19]
Johnson

[11] Patent Number: 5,726,601
[45] Date of Patent: Mar. 10, 1998

[54] INTEGRATED CIRCUIT AND METHOD FOR PRODUCING THE SAME

[75] Inventor: Bret A. Johnson, München, Germany

[73] Assignee: Siemens Aktiengesellschaft, Munich, Germany

[21] Appl. No.: 647,464

[22] Filed: May 3, 1996

[30] Foreign Application Priority Data

May 5, 1995 [EP] European Pat. Off. ............ 95106850

[51] Int. Cl.⁶ .................................................. H01L 23/48
[52] U.S. Cl. .................................... 327/565; 327/566
[58] Field of Search ................... 327/564–566; 326/101, 102

[56] References Cited

U.S. PATENT DOCUMENTS

| | | |
|---|---|---|
| 4,556,806 | 12/1985 | Amix . |
| 5,051,622 | 9/1991 | Pleva . |
| 5,557,235 | 9/1996 | Koike ........................... 327/565 |
| 5,557,236 | 9/1996 | Monti ........................... 327/565 |

FOREIGN PATENT DOCUMENTS

| | | |
|---|---|---|
| 0342590 | 11/1989 | European Pat. Off. . |
| 5070158 | 11/1993 | European Pat. Off. . |
| 3-201453 | 9/1991 | Japan ........................... 327/565 |
| 4-239816 | 8/1992 | Japan ........................... 327/565 |
| 5-1362000 | 6/1993 | Japan ........................... 327/565 |

Primary Examiner—Timothy P. Callahan
Assistant Examiner—T. T. Lam
Attorney, Agent, or Firm—Herbert L. Lerner; Laurence A. Greenberg

[57] ABSTRACT

An integrated circuit includes a data terminal, a supply potential terminal, a configuration signal generator with an input, a buffer circuit with a terminal and a bond pad connected to the input and the terminal. The bond pad is connected to the data terminal for operating the integrated circuit using the buffer circuit and the bond pad is connected to the supply potential terminal for operating the integrated circuit using the configuration signal generator. A method for producing such an integrated circuit includes connecting the input of the configuration signal generator and the terminal of the buffer circuit to the bond pad. The bond pad is connected to the supply potential terminal for operating the finished integrated circuit using the configuration signal generator, or to the data terminal for operating the finished integrated circuit using the buffer circuit.

13 Claims, 3 Drawing Sheets

INTEGRATED CIRCUIT AND METHOD FOR PRODUCING THE SAME

BACKGROUND OF THE INVENTION

1. Field of the Invention

The invention relates to an integrated circuit having contacting locations that are connectable to external terminals of the integrated circuit through bonding wires. The invention also relates to a method for producing the integrated circuit.

Such contacting locations are generally known as "bond pads". They must have adequate dimensions to allow the bonding wires to be secured to them. In the layout of an integrated circuit, the bonding locations therefore occupy a significant portion of the available surface area. In order to configure integrated circuits or in other words to put them into various operating states, it is known to use configuration signals. Such a configuration signal can be generated with the aid of a configuration signal generator, having an output which is determined by the potential at its input.

SUMMARY OF THE INVENTION

It is accordingly an object of the invention to provide an integrated circuit and a method for producing the same, which overcome the hereinafore-mentioned disadvantages of the heretofore-known devices and methods of this general type and in which the circuit requires little space.

With the foregoing and other objects in view there is provided, in accordance with the invention, an integrated circuit, comprising a data terminal and a supply potential terminal; a configuration signal generator with an input; a buffer circuit with a terminal; and a bond pad connected to the input and the terminal; the bond pad being connected to the data terminal for operating the integrated circuit using the buffer circuit; and the bond pad being connected to the supply potential terminal for operating the integrated circuit using the configuration signal generator.

The integrated circuit of the invention makes it possible to produce two variants of an integrated circuit from the same layout and using the same masks. In the first variant, the configuration signal generator can be used, and in the second variant the buffer circuit can be used, but in neither variant can both of them be used. In order to produce the first variant, the common bond pad is connected by a bonding wire to the supply potential terminal, while to produce the second variant it is conversely connected to the data terminal. In this way it is possible to delay the decision as to which variant is to be made until the end of the production process of the integrated circuit, by deciding which type of bonding of the bond pad will be employed.

The integrated circuit has fewer bond pads than comparable circuits, because only a single common bond pad is necessary for both the configuration signal generator and the buffer circuit. It can therefore be manufactured in such a way that it requires little space.

In particular, the invention is therefore suitable for later modification of an existing layout of an integrated circuit, since then as a rule hardly any free space is still available for accommodating additional components. In that case, only one additional common bond pad, instead of two bond pads, is necessary to allow the alternative use of an additional configuration signal generator or an additional buffer circuit.

If, in another case, a configuration signal generator which is intended to be usable in a first variant of the integrated circuit is already present, and if alternatively an additional buffer circuit is intended to be usable for the second variant, then only the buffer circuit has to be added. An additional bond pad is then entirely unnecessary. The same is true if a buffer circuit is already present and an alternatively usable configuration signal generator is to be added.

If a plurality of configuration signal generators and buffer circuits are present, then more than two variants of the integrated circuit can be manufactured through the use of common bond pads for at least one configuration signal generator and one buffer circuit each.

In accordance with another feature of the invention, the configuration signal generator has a first activation device for receiving a first activation signal to activate and deactivate the configuration signal generator.

In accordance with a further feature of the invention, the buffer circuit has second activation devices for receiving a second activation signal to activate and deactivate the buffer circuit.

In accordance with an added feature of the invention, the buffer circuit is an input buffer circuit and the terminal is an input of the input buffer circuit.

In accordance with an additional feature of the invention, the buffer circuit is an output buffer circuit and the terminal is an output of the output buffer circuit.

In accordance with yet another feature of the invention, the supply potential terminal has a supply potential, the configuration signal generator has an output connected to the input of the configuration signal generator, and there is provided a resistor element connecting the input of the configuration signal generator to a first potential differing from the supply potential at the supply potential terminal.

In accordance with yet a further feature of the invention, there is provided at least one activation transistor connected in series with the resistor element between the input of the configuration signal generator and the first potential, the at least one activation transistor having a gate for receiving a third activation signal.

In accordance with yet an added feature of the invention, the configuration signal generator has an output connected through the first activation device to the input of the configuration signal generator.

In accordance with yet an additional feature of the invention, the first activation device is a logic gate, such as a NAND gate or a NOR gate, having one input being the input of the configuration signal generator, a further input for receiving the first activation signal, and an output being the output of the configuration signal generator.

In accordance with again another feature of the invention, the first activation signal matches the third activation signal, or the first activation signal matches the second activation signal.

With the objects of the invention view there is also provided a method for producing an integrated circuit having a configuration signal generator with an input, a buffer circuit with a terminal, a bond pad, a data terminal, and a supply potential terminal, which comprises connecting the input of the configuration signal generator and the terminal of the buffer circuit to the bond pad; and connecting the bond pad to the supply potential terminal for operating the finished integrated circuit using the configuration signal generator, or connecting the bond pad to the data terminal for operating the finished integrated circuit using the buffer circuit.

If the configuration signal generator is activatable and deactivatable, then if the second variant of the integrated circuit has been made it can be switched to be inactive, because then the configuration signal is not needed. This offers the advantage of ensuring that the further integrated circuit circuit elements that are connected to it, will not be affected by changes in the configuration signal that would otherwise occur. If the buffer circuit is activatable and deactivatable, the same is true for the first variant of the integrated circuit and for the circuit components following the buffer circuit.

It is possible for this same bond pad to be connected to a further supply potential terminal of the integrated circuit. In order to use the configuration signal generator, this generator can then be connected selectively, through this same bond pad, to the supply potential terminal (such as $V_{DD}$) or the further supply potential terminal (such as $V_{SS}$). Therefore, the state of the configuration signal depends on which of the supply potential terminals the bond pad is connected to. The state of the configuration signal can match the applicable supply potential.

Other features which are considered as characteristic for the invention are set forth in the appended claims.

Although the invention is illustrated and described herein as embodied in an integrated circuit and a method for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
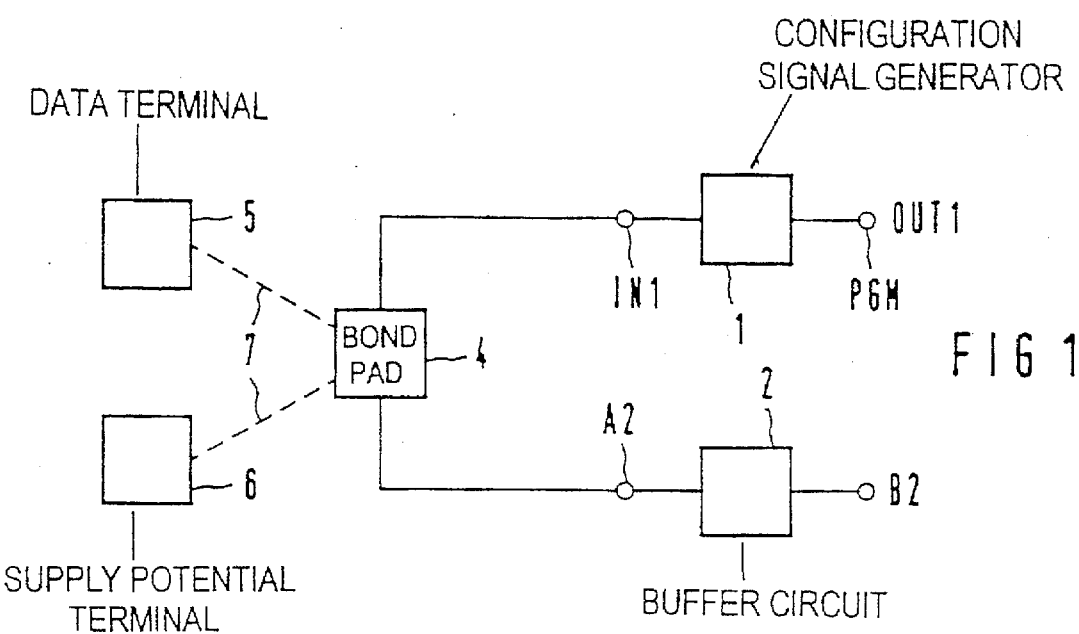
FIGS. 1 and 2 are block circuit diagrams of exemplary embodiments of the invention.

Referring now in detail to the figures of the drawings, in which only the components that are important to the invention are shown, and first, particularly, to FIG. 1 thereof, there is seen a contacting location (bond pad) 4 of an integrated circuit, which can be connected through bonding wires 7 to a data terminal 5 and to a supply potential terminal 6, wherein the terminals 5, 6 are external terminals of the integrated circuit. The bond pad 4 is connected to one input IN1 of a configuration signal generator 1 and to one terminal A2 of a buffer circuit 2. ESD protection circuits, which are typically present but are not relevant to the invention, have not been shown in the drawing. A further terminal B2 of the buffer circuit 2 and an output OUT1 of the configuration signal generator 1 are connected to other non-illustrated circuit components of the integrated circuit.

It is now assumed that in a first variant of the integrated circuit, the configuration signal generator 1 is needed, while in another, second variant the buffer circuit 2 is needed. In order to put the configuration signal generator 1 into operation (first variant), the bond pad 4 is connected either with none of the external terminals 5, 6 or with the supply potential terminal 6. In order to put the buffer circuit 2 into operation (second variant), the bond pad 4 is connected to the data terminal 5 through the bonding wire 7. It is now possible, with the same layout, to produce a configurable integrated circuit in which the decision as to which variant of this integrated circuit is being made is not defined until the bonding that concludes the production process is done.

Figure 2:
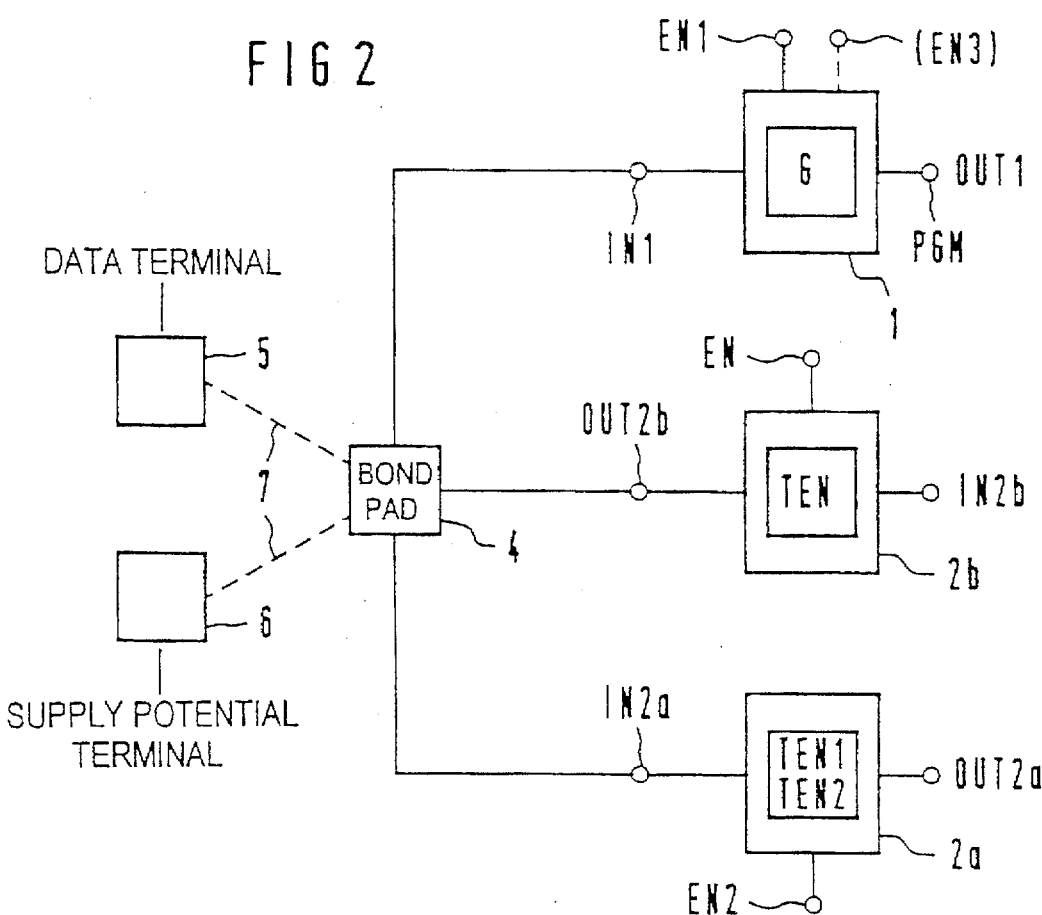

Depending on whether the data terminal 5 is a data input or a data output, the buffer circuit 2 is an input buffer circuit 2a or an output buffer circuit 2b, which are shown in FIG. 2.

The configuration signal generator 1 generates a configuration signal PGM at its output OUT1, as a function of a potential at its input IN1. This signal PGM can assume two different potential values. The configuration signal PGM has a first potential value if the bond pad 4 is not bonded. It has a second potential value if the bond pad 4 is connected to the supply potential terminal 6. Embodiments of the configuration signal generator 1 are shown in FIGS. 3, 5a, 5b and 5c and will be described below.

FIG. 2 shows another exemplary embodiment of the invention, in which besides the input IN1 of the configuration signal generator 1, an input IN2a of the input buffer circuit 2a and an output OUT2b of the output buffer circuit 2b are connected to the same bond pad 4. The output buffer circuit 2b has the function of an output driver. Besides a variant of the integrated circuit in which the configuration signal generator 1 is used, a variant can also be attained in which instead the data terminal 5 is usable as an additional data input and data output.

Figure 4A:
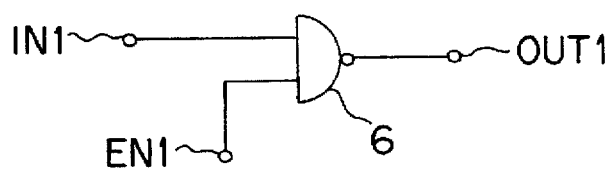
FIGS. 4a and 4b are schematic circuit diagrams of an exemplary embodiment of a first activation device.

The configuration signal generator 1 has a first activation device G, to which a first activation signal EN1 can be applied to activate it. FIG. 4a shows one possible embodiment of the configuration signal generator 1 with the first activation device G. A third activation signal EN3 can also be applied to the configuration signal generator 1 and its function will be described below in conjunction with FIGS. 5a, 5b and 5c.

The input buffer circuit 2a in FIG. 2 has two activation devices TEN1, TEN2, which are controllable through a second activation signal EN2 that can be applied. An exemplary embodiment of the second activation devices TEN1, TEN2 will be described below in conjunction with FIG. 6.

Through the use of the first activation signal EN1 and the second activation signal EN2 shown in FIG. 2, it is possible in the variant of the integrated circuit in which the configuration signal generator 1 is usable, to make this generator 1 activatable and to make the input buffer circuit 2a inactivatable. The reverse is true for the other variant.

By using the first activation device G for inactivating the configuration signal generator 1, when the input buffer circuit 2a, which in that case is connected to the data terminal 5 through the bond pad 4, is used, it is possible to prevent changes in the potential at the bond pad 4 from affecting circuit components of the integrated circuit that are connected to the output OUT1 of the configuration signal generator 1, which is not usable in this variant. The same is true for the second activation devices TEN1, TEN2 with respect to the inactivation of the input buffer circuit 2a, if the configuration signal generator 1 is usable and if the bond pad 4 is either not bonded at all or is connected to the supply potential terminal 6.

If the configuration signal generator 1 and the input buffer circuit 2 are activatable by logic levels that are complementary to one another, then the first activation signal EN1 can match the second activation signal EN2.

The output buffer circuit 2b in FIG. 2 has an activation device TEN. Through the use of the activation device TEN, the buffer circuit can be activated and deactivated by using an activation signal EN. The output OUT2b of the output buffer circuit 2b has high impedance in the deactivated state. When the configuration signal generator 1 is used, it is thus possible to preclude influence on the potential at the bond pad 4 caused by disruptions at an input IN2b of the output buffer circuit 2b. The input IN2b of this circuit is connected to non-illustrated components of the integrated circuit.

Figure 6:
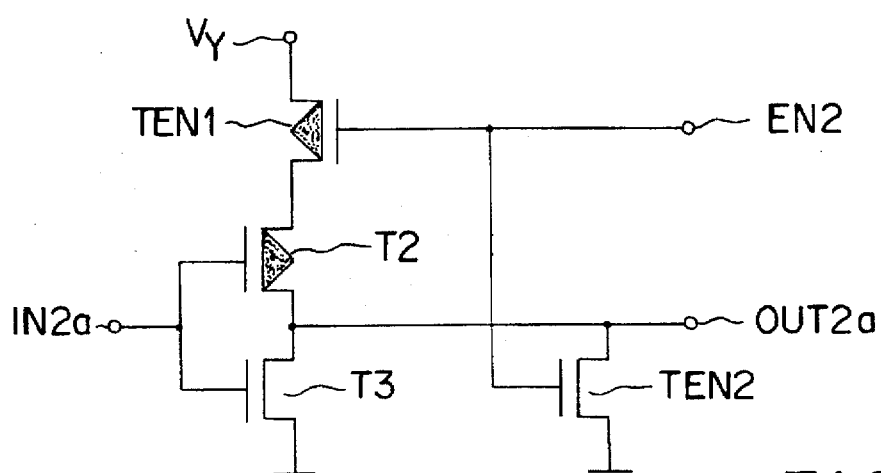
FIG. 6 is a schematic circuit diagram of an exemplary embodiment of an input buffer circuit.

FIG. 6 shows one possible example of an embodiment of an input buffer circuit 2a. This circuit will be described below. Other possible embodiments of buffer circuits 2, especially output buffer circuits 2b, which have the function of output drivers, and of corresponding activation devices TEN1, TEN2, are known to one skilled in the art and therefore need not be described in further detail herein.

Figure 3:
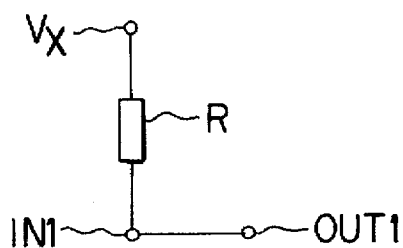

FIG. 3 shows an exemplary embodiment of the configuration signal generator 1 shown in FIG. 1, which has no activation device G. The configuration signal generator has an input IN1 connected to its output OUT1. The input IN1 is also connected, through a resistor element R, to a first potential $V_x$, which differs from the supply potential at the supply potential terminal 6. The first potential $V_x$ may, for instance, be a different supply potential of the integrated circuit.

The resistor element R may, for example, be an ohmic resistor or a transistor connected as a resistor. The first potential $V_x$ may be higher or lower than the potential at the supply potential terminal 6, so that the resistor element R takes on the function of a pullup or a pulldown resistor.

Figure 4B:
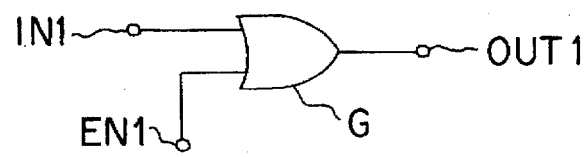

FIG. 4a shows an exemplary embodiment of the first activation device G of the configuration signal generator 1 shown in FIG. 2. The first activation device G is constructed in this case by a NAND gate. An output of the gate G is the output OUT1 of the configuration signal generator 1. One input of the gate G is the input IN1 of the configuration signal generator 1. The first activation signal EN1 can be applied through a further input of the gate G. Instead of a NAND gate, other gates (such as NOR gates as shown in FIG. 4b) can, for instance, be used to provide the first activation device G. The first activation signal EN1 need merely be adapted accordingly, so that activation and deactivation are made possible.

Figure 5A:
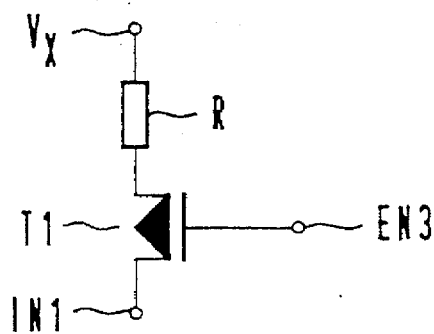
FIGS. 3, 5a, 5b and 5c are schematic circuit diagrams of exemplary embodiments of a configuration signal generator.
Figure 5B:
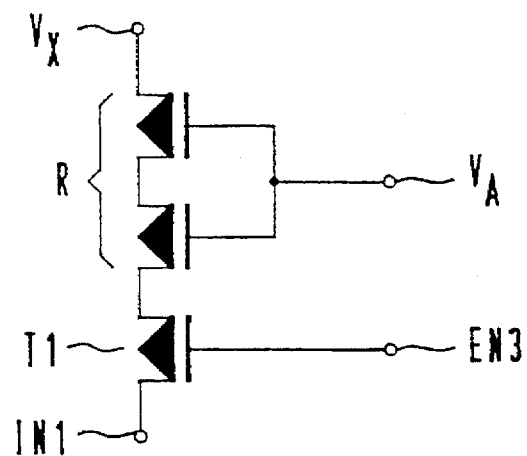
Figure 5C:
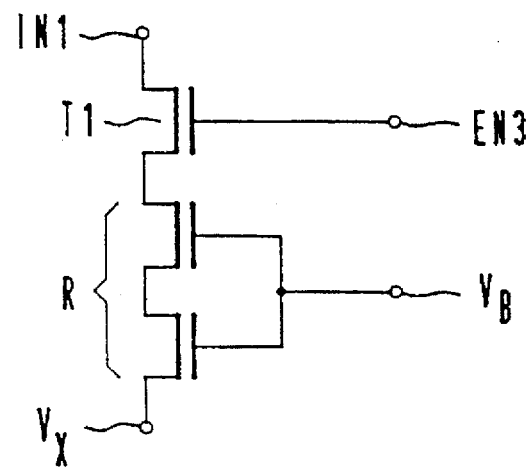

FIGS. 5a, 5b and 5c show three further exemplary embodiments of the configuration signal generator 1, without the first activation device G. In these exemplary embodiments, the input IN1 of the configuration signal generator 1 can be disconnected from the first potential $V_x$ through the use of the third activation signal EN3, which can be applied to a gate of an activation transistor T1. This disconnection is intended to be effected simultaneously with the inactivation of this generator through the use of the first activation signal EN1. If an activation through the use of the first and third activation signals EN1 and EN3 at the same logical level takes place, then the two activation signals EN1, EN3 can match one another.

FIG. 5a shows the activation transistor T1 between the input IN1 and the first potential $V_x$, in series with the resistor element R. The activation transistor T1 is of the p-channel type.

In FIGS. 5b and 5c, the resistor element R is constructed by two series-connected field-effect transistors, having gates which are connected to a second potential $V_A$. In FIG. 5b, the two field-effect transistors forming the resistor element R and the activation transistor T1 are of the p-channel type, while in FIG. 5c they are of the n-channel type. These versions are especially suitable for a later change in a layout, in which the resistor element R is already included in the form of a series circuit of a plurality of transistors. Then by merely making small changes in the layout, one of these transistors can be used as the activation transistor T1.

The versions of FIGS. 5a and 5b are suitable for use for first potentials $V_x$ that are higher than the possible potentials at the input IN1 of the configuration signal generator 1. The version of FIG. 5c is suitable for those in which the first potential $V_x$ is lower than the possible potentials at the input IN1.

Through the use of the third activation signal EN3, a current is prevented from flowing between the bond pad 4 and the first potential $V_x$ if the buffer circuit 2 is active and the configuration signal generator 1 is inactive. It is thus accomplished that the input signals of the input buffer circuit 2a or the output signals of the output buffer circuit 2b are unaffected. A leakage current from or to the first potential $V_x$ is avoided, and thus an additional capacitive load on the bond pad 4 is prevented. This is particularly decisive for input buffer circuits 2a, because usually these circuits cannot be allowed to have more than a very slight capacitive input load.

FIG. 6 shows a version of an input buffer circuit 2a. The input buffer circuit has a CMOS inverter, with a p-channel transistor T2 and an n-channel transistor T3. Gates of these two transistors are connected to one another and form the input IN2a of the input buffer circuit 2a. A source of the n-channel transistor T3 is connected to a low supply potential, ground, of the integrated circuit. A drain of the n-channel transistor T3 and of the p-channel transistor T2 are connected to one another and form an output OUT2a of the input buffer circuit 2a.

The input buffer circuit 2a also has two activation devices TEN1, TEN2 in the form of first and second enable transistors. A source of the p-channel transistor T2 is connected, through the first enable transistor TEN1 of the p-channel type, to a high supply potential $V_Y$ of the integrated circuit. The output OUT2a of the input buffer circuit 2a is connected through the second enable transistor TEN2 of the n-channel type to the low supply potential, ground. Gates of the two enable transistors TEN1, TEN2 are connected to the second activation signal EN2.

If the input buffer circuit 2a can be allowed to be activated constantly through the second activation signal EN2 (which is the case with clock inputs, for instance), then this signal may be equal to or complementary to the first activation signal EN1, which must simultaneously switch the configuration signal generator 1 to be inactive. If conversely the input buffer circuit 2a is intended to only be active intermittently, by a change of sign of the second activation signal EN2, then the two activation signals must be independent of one another.

I claim:
1. An integrated circuit, comprising:
a data terminal and a supply potential terminal;
a configuration signal generator with an input;
a buffer circuit with a terminal; and
a bond pad connected to the input and the terminal;
said bond pad being connected to said data terminal for operating the integrated circuit using said buffer circuit; and said bond pad being connected to said supply potential terminal for operating the integrated circuit using said configuration signal generator.

2. The integrated circuit according to claim 1, wherein said configuration signal generator has an activation device for receiving an activation signal to activate and deactivate said configuration signal generator.

3. The integrated circuit according to claim 1, wherein said buffer circuit has activation devices for receiving an activation signal to activate and deactivate said buffer circuit.

4. The integrated circuit according to claim 1, wherein said buffer circuit is an input buffer circuit and the terminal is an input of said input buffer circuit.

5. The integrated circuit according to claim 1, wherein said buffer circuit is an output buffer circuit and said terminal is an output of said output buffer circuit.

6. The integrated circuit according to claim 1, wherein said supply potential terminal has a supply potential, said configuration signal generator has an output connected to the input of said configuration signal generator, and including a resistor element connecting the input of said configuration signal generator to a first potential differing from the supply potential at said supply potential terminal.

7. The integrated circuit according to claim 6, including at least one activation transistor connected in series with said resistor element between the input of said configuration signal generator and the first potential, said at least one activation transistor having a gate for receiving an activation signal.

8. The integrated circuit according to claim 2, wherein said configuration signal generator has an output connected through said activation device to the input of said configuration signal generator.

9. The integrated circuit according to claim 8, wherein said activation device is a logic gate having one input being the input of said configuration signal generator, a further input for receiving the activation signal, and an output being the output of said configuration signal generator.

10. The integrated circuit according to claim 9, wherein that said logic gate is a NAND gate.

11. The integrated circuit according to claim 9, wherein said logic gate is a NOR gate.

12. The integrated circuit according to claim 2, wherein said buffer circuit has activation devices for receiving another activation signal to activate and deactivate said buffer circuit, and the activation signal at said activation device of said configuration signal generator matches the another activation signal at said activation devices of said buffer circuit.

13. A method for producing an integrated circuit having a configuration signal generator with an input, a buffer circuit with a terminal, a bond pad, a data terminal, and a supply potential terminal, which comprises:

connecting the input of the configuration signal generator and the terminal of the buffer circuit to the bond pad; and connecting the bond pad:

to the supply potential terminal for operating a finished integrated circuit using the configuration signal generator, or to the data terminal for operating the finished integrated circuit using the buffer circuit.

* * * * *